(12) United States Patent
Kato et al.

(10) Patent No.: US 8,351,875 B2
(45) Date of Patent: Jan. 8, 2013

(54) DISTORTION COMPENSATOR, DISTORTION COMPENSATION METHOD, AND TRANSMITTER

(75) Inventors: Takayuki Kato, Kawasaki (JP); Atsushi Yamaoka, Kawasaki (JP); Keiichi Yamaguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 682 days.

(21) Appl. No.: 12/585,443

(22) Filed: Sep. 15, 2009

(65) Prior Publication Data

US 2010/0159856 A1 Jun. 24, 2010

(30) Foreign Application Priority Data

Dec. 22, 2008 (JP) ................. P2008-325401

(51) Int. Cl.
*H04B 1/04* (2006.01)
(52) U.S. Cl. ............... 455/114.2; 455/114.3; 455/126; 375/296
(58) Field of Classification Search ............ 455/67.13, 455/114.2–115.1, 126–127.2; 375/296–297
See application file for complete search history.

(56) References Cited

U.S. PATENT DOCUMENTS

| | | | |
|---|---|---|---|
| 5,905,760 A | 5/1999 | Schnabl et al. | |
| 6,798,843 B1 * | 9/2004 | Wright et al. | 375/296 |
| 7,515,650 B1 * | 4/2009 | Warner et al. | 375/302 |
| 8,064,851 B2 * | 11/2011 | McCallister | 455/114.3 |
| 2002/0085647 A1 * | 7/2002 | Oishi et al. | 375/297 |
| 2009/0124218 A1 * | 5/2009 | McCallister et al. | 455/114.2 |
| 2009/0256630 A1 * | 10/2009 | Brobston | 330/2 |
| 2009/0291650 A1 * | 11/2009 | Singerl et al. | 455/114.3 |

FOREIGN PATENT DOCUMENTS

| | | |
|---|---|---|
| JP | 10-13160 | 1/1998 |
| JP | 3789422 | 4/2006 |

OTHER PUBLICATIONS

Deng et al., "A SiGe PA With Dual Dynamic Bias Control and Memoryless Digital Predistortion for WCDMA Handset Applications", *IEEE Journal of Solid-State Circuits*, vol. 41, No. 5, May 2006, pp. 1210-1221.
R. Walden, "Analog-to-Digital Converter Survey and Analysis", *IEEE Journal on Selected Areas in Communications*, vol. 17, No. 4, Apr. 1999, pp. 539-550.
Japanese Office Action issued for Japanese Patent Application No. JP2008-325401, dated Feb. 7, 2012 with English Translation.

* cited by examiner

*Primary Examiner* — Simon Nguyen
(74) *Attorney, Agent, or Firm* — Nixon & Vanderhye P.C.

(57) ABSTRACT

A distortion compensator for reducing a level of a distortion component included in an output analog signal of an amplifier, includes: an A/D converter to convert the output analog signal of the amplifier into a digital output signal; a comparator to generate a distortion characteristic of the amplifier based on a digital input signal and the digital output signal; a rate controller to control a sampling rate of the A/D converter based on the digital input signal and the digital output signal; a predistorter to multiply the digital input signal and a compensation value for compensating the amplifier, the compensation value being calculated based on the digital input signal and the distortion characteristic of the amplifier; and a D/A converter to convert multiplication result of the predistorter into an analog input signal to input the analog input signal to the amplifier.

17 Claims, 6 Drawing Sheets

$f_{s\_max}$ :ADC MAXIMUM SAMPLING FREQUENCY
$BW_{ADC}$ :ADC BANDWIDTH
$DR_{ADC}$ :ADC DYNAMIC RANGE

DISTORTION COMPENSATOR, DISTORTION COMPENSATION METHOD, AND TRANSMITTER

CROSS-REFERENCE TO RELATED APPLICATIONS

This application is based upon and claims the benefit of priority from the prior Japanese Patent Application No. 2008-325401, filed on Dec. 22, 2008; the entire contents of which are incorporated herein by reference.

BACKGROUND OF THE INVENTION

1. Field of the Invention

The present invention relates to a distortion compensator, a transmitter, and a distortion compensation method used for, for example, a radio communication system and so on, and particularly relates to a distortion compensator, a transmitter, and a distortion compensation method using a distortion compensation technology of a power amplifier.

2. Description of the Related Art

Conventionally, a digital pre-distortion technique has been used as one of distortion compensation technologies of a power amplifier. An output signal of the power amplifier is fed back to a digital signal processor via an analog-digital converter (hereinafter, referred to as an "ADC"), and is compared with an input signal of the power amplifier, in a transmitter applying the digital pre-distortion technique. Distortion characteristics opposite to the distortion characteristics of the power amplifier are calculated based on the comparison result, and this opposite distortion characteristics are multiplied with the input signal of the power amplifier. A signal obtained by the multiplication is inputted to the power amplifier, and thereby, a distortion component included in the output signal of the power amplifier is canceled. (refer to Junxiong Deng, Prasad S. Gudem, Lawrence E. Larson, Donald F. Kimball, and Peter M. Asbeck, "A SiGe PA With Dual Dynamic Bias Control and Memoryless Digital Predistortion for WCDMA Handset Applications", IEEE JOURNAL OF SOLID-STATE CIRCUITS, VOL. 41, NO. 5, pp. 1210-1221, MAY 2006)

In the conventional digital pre-distortion technique, a sampling rate of the ADC is always constant, and therefore, an A/D conversion is performed with a certain accuracy and sampling rate regardless of presence/absence of the distortion component in the output signal of the power amplifier. Accordingly, a constant calculation amount is always required in the distortion compensation process, and as a result, a constant power consumption, apparatus scale, countermeasure for heat generation and so on are always required.

BRIEF SUMMARY OF THE INVENTION

As stated above, constant power consumption is always required, and constant levels are required as for the apparatus scale, the countermeasure for heat generation, and so on in the conventional digital pre-distortion technique because the A/D conversion is always performed with a constant accuracy and sampling rate regardless of a residual distortion level. The present invention is made to solve the problem as stated above, and an object thereof is to provide a distortion compensator, a transmitter, and a distortion compensation method capable of effectively suppressing the power consumption, the heat generation, and so on, and suppressing an apparatus scale.

A distortion compensator according to an aspect of the present invention reduces a level of a distortion component included in an output analog signal of an amplifier, and includes: an A/D converter to convert the output analog signal of the amplifier into a digital output signal; a comparator to generate a distortion characteristic of the amplifier based on a digital input signal and the digital output signal; a rate controller to control a sampling rate of the A/D converter based on the digital input signal and the digital output signal; a predistorter to multiply the digital input signal and a compensation value for compensating the amplifier, the compensation value being calculated based on the digital input signal and the distortion characteristic of the amplifier; and a D/A converter to convert multiplication result of the predistorter into an analog input signal to input the analog input signal to the amplifier.

DETAILED DESCRIPTION OF THE INVENTION

The present embodiment relates to a technique enabling a reduction of power consumption of a radio transmitter using a digital pre-distortion technique. Namely, the power consumption of the transmitter is reduced by adaptively changing electric characteristics of circuits and so on used in a digital pre-distortion process in accordance with a residual distortion level included in an output signal of a power amplifier. In addition, heat generation can be suppressed and an apparatus scale can be made small owing to the reduction of the power consumption. Hereinafter, embodiments of the present invention are described in detail with reference to the drawings.

Figure 1:
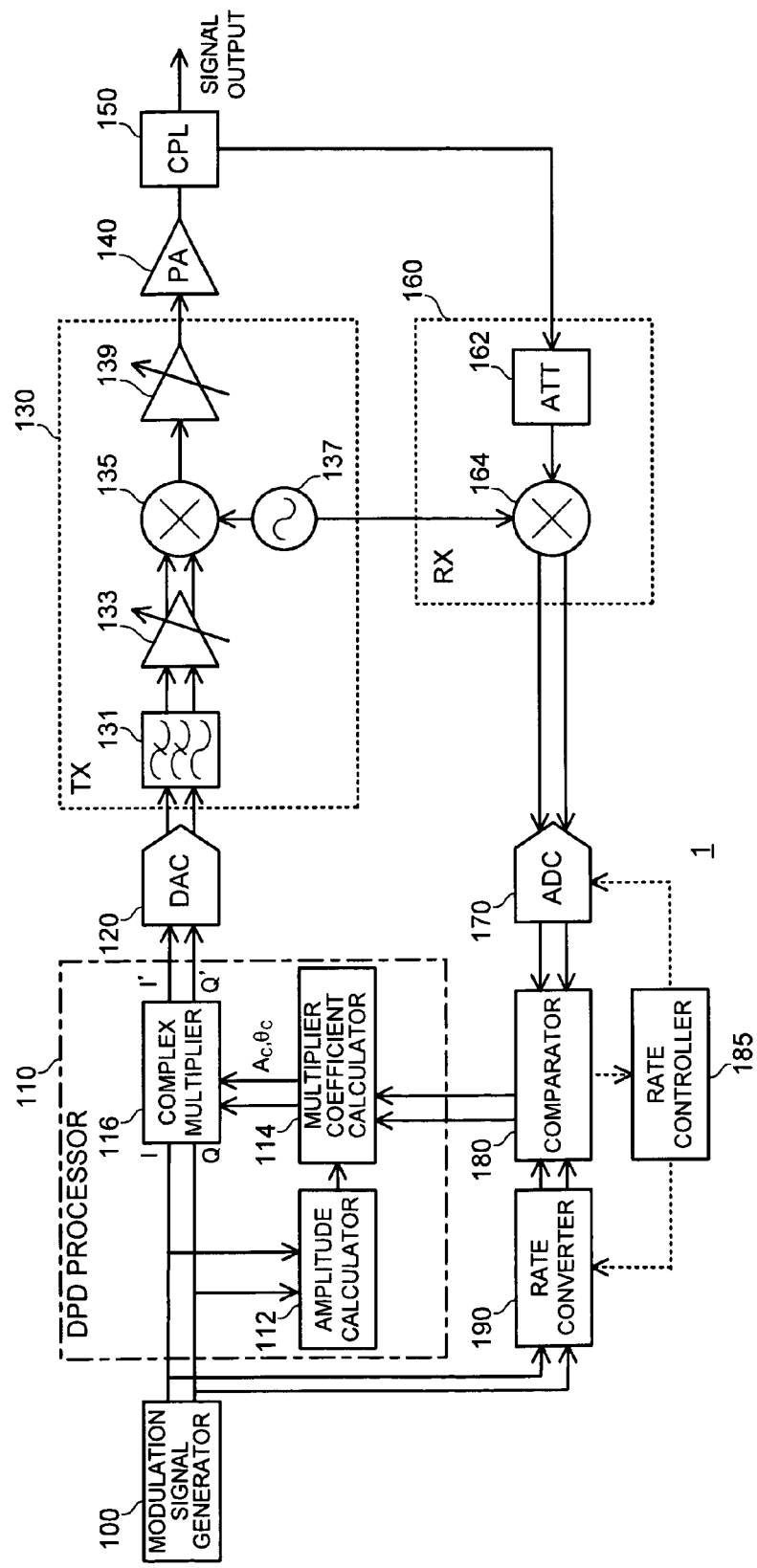
FIG. 1 is a block diagram illustrating a transmitter according to an embodiment.

(Description of Embodiments) As illustrated in FIG. 1, a transmitter 1 according to this embodiment includes a modulation signal generator 100, a digital pre-distortion (DPD) processor 110, a digital-analog converter 120 (DAC 120), a signal processor for transmitted signal 130, a power amplifier 140 (PA 140), a power divider 150 (CPL 150), a signal processor for received signal 160, an analog-digital converter 170 (ADC 170), a comparator 180, a rate controller 185 and a rate converter 190.

The modulation signal generator 100 generates a modulation signal which is transmitted by a transmitter of this embodiment. The modulation signal generator 100 is implemented by a signal processor generating, for example, a complex modulation signal (Ich, Qch) in which a digital modulation such as a QPSK and a 64 QAM are performed, and a modulation signal in which a secondary modulation is performed such as an OFDM. The modulation signal generated by the modulation signal generator 100 is made with a predetermined transmission rate (a first sampling rate). The modulation signal generator 100 supplies the generated modulation signal to the DPD processor 110 and the rate converter 190.

The DPD (Digital Pre-Distortion) processor 110 performs a distortion compensation process on a transmission signal at a digital signal stage. The DPD processor 110 is implemented by, for example, an FPGA (Field Programmable Gate Array) and so on, and has an amplitude calculator 112, a multiplier coefficient calculator 114 and a complex multiplier 116. The modulation signal received by the DPD processor 110 from the modulation signal generator 100 is each provided to the amplitude calculator 112 and the complex multiplier 116.

The amplitude calculator 112 calculates an amplitude value A of the modulation signal received from the modulation signal generator 100, and provides the calculation result to the multiplier coefficient calculator 114. The modulation signal generated by the modulation signal generator 100 is a complex modulation signal, and therefore, the amplitude value A can be obtained by the following expression.

$$A = I^2 + Q^2 \quad (1)$$

I: amplitude value of Ich signal
Q: amplitude value of Qch signal

The multiplier coefficient calculator 114 stores a coefficient to compensate a distortion signal component generated at the later-described power amplifier 140, and outputs a predetermined multiplier coefficient based on the amplitude value A calculated by the amplitude calculator 112 by reading or calculating it. An amplitude $A_o$ and a phase $\theta_o$ of an output signal of the power amplifier 140 including the distortion signal component can be defined by the following polynomial of an amplitude $A_i$ of an input signal.

$$A_O = a_0 + a_1 \cdot A_i + a_2 \cdot A_i^2 + a_3 \cdot A_i^3 +$$

$$\theta_O = \theta_0 + b_1 \cdot A_i + b_2 \cdot A_i^2 + b_3 \cdot A_i^3 + \quad (2)$$

$a_n$=const.
$b_n$=const.
n=0, 1, 2, 3 . . .

Characteristics defined by the polynomial as stated above become distortion characteristics of the power amplifier 140. The multiplier coefficient calculator 114 has an area storing coefficients (distortion characteristic) constituting the polynomial, and the multiplier coefficient compensating the distortion signal component can be obtained by using the amplitude value A. The multiplier coefficient calculator 114 may have an area storing the obtained multiplier coefficient. These coefficients are provided from the later-described comparator 180, and they are updated accordingly.

The complex multiplier 116 multiplies the modulation signal received from the modulation signal generator 100 and the multiplier coefficient provided by the multiplier coefficient calculator 114, and provides the obtained digital complex signal to the DAC 120. The DAC 120 converts the received digital complex signal into an analog complex base-band signal at a first sampling rate, and provides it to the transmission signal processing block 130.

The transmission signal processing block 130 has a low-pass filter 131 (LPF 131), a grain variable amplifier 133, a quadrature modulator 135, a local oscillator 137 and a driver amplifier 139, and converts the analog complex base-band signal into a radio frequency transmission signal. The LPF 131 removes an aliasing signal from the analog complex base-band signal received from the DAC 120. The gain variable amplifier 133 amplifies the analog complex base-band signal filtered by the LPF 131 into a predetermined level, and provides it to the quadrature modulator 135.

The local oscillator 137 generates a local signal to convert a base-band signal into a predetermined radio frequency. The quadrature modulator 135 multiplies the analog complex base-band signal received from the gain variable amplifier 133 and the local signal generated by the local oscillator 137, and generates a transmission signal with predetermined radio frequency. The driver amplifier 139 amplifies the transmission signal generated by the quadrature modulator 135 into a level suitable for power amplification.

The power amplifier 140 amplifies the transmission signal generated by the transmission signal processing block 130 into a predetermined power level. The power amplifier 140 can be implemented by various constitutions or an operational class amplifier in accordance with a kind and so on of the modulation signal, such as a Doherty amplifier. The distortion component for some extent is included in the output signal of the power amplifier 140. The power divider 150 is a coupler having a function to divide a part of the transmission signal amplified by the power amplifier 140. The power divider 150 can be implemented by, for example, a coupled circuit by an LC circuit, a coupled circuit by a capacitor, or the like. The power divider 150 distributes the transmission signal to the reception signal processing block 160 and to a subsequent antenna, and so on.

The reception signal processing block 160 has an attenuator 162 (ATT 162) and a quadrature demodulator 164, and converts the transmission signal distributed by the power divider 150 into an analog complex base-band signal. The ATT 162 attenuates the transmission signal distributed by the power divider 150 into a predetermined level. An attenuation amount by the ATT 162 is set to be a value in which the transmission signal distributed by the power divider 150 becomes a signal level which can be allowed by the later-described ADC 170. The quadrature demodulator 164 multiplies the transmission signal attenuated by the ATT 162 and the local signal generated by the local oscillator 137, and generates the analog complex base-band signal. The analog complex base-band signal generated by the quadrature demodulator 164 is provided to the ADC 170.

The ADC 170 converts the analog complex base-band signal provided from the quadrature demodulator 164 of the reception signal processing block 160 into a digital complex signal at the above-stated first sampling rate, and provides it to the comparator 180. The ADC 170 can be implemented by; for example, a delta-sigma type analog digital converter, and so on.

The comparator 180 compares the original digital complex signal provided via the rate converter 190 and the digital complex signal provided via the ADC 170, and calculates the distortion characteristics of the power amplifier 140. The comparator 180 can be implemented by, for example, a signal processor and so on. The comparator 180 compares a source signal generated by the modulation signal generator 100 and a signal in which the output signal of the power amplifier 140 is demodulated, calculates the coefficients of the distortion characteristic expression of the power amplifier 140 represented by, for example, the formula 2, and provides the coefficients to the multiplier coefficient calculator 114. The multiplier coefficient calculator 114 calculates a correction gain $A_c$ at each input power level or a signal amplification level and a rotation amount $\theta_c$ of a phase provided by a distortion, based on the distortion characteristics (coefficients) as stated above. The multiplier coefficient calculator 114 provides an initial value held by itself to the complex multiplier 116 because the amplitude value A does not exist in an initial state, but the coefficients are updated when the output signal of the power amplifier 140 is fed back and the distortion characteristics of the power amplifier 140 are calculated.

Incidentally, in the present embodiment, the comparator 180 compares the source signal and a demodulation signal, calculates the coefficients of the distortion characteristic expression, and provides it to the multiplier coefficient calculator 114. The multiplier coefficient calculator 114 calculates the correction gain $A_c$ and the rotation amount $\theta_c$ of the phase based on the provided coefficients and the input power level, and provides the calculation result to the complex multiplier 116. However, the present embodiment is not limited to the above. Namely, it may be constituted such that the comparator 180 calculates all of steps up to correction values (for example, the correction gain $A_c$ and the rotation amount $\theta_c$ of the phase) to cancel the distortion characteristics by using the coefficients of the distortion characteristic expression of the power amplifier 140, and the multiplier coefficient calculator 114 stores the obtained correction values. Namely, the multiplier coefficient calculator 114 may be functioned as a data storage unit. In this case, the complex multiplier 116 may read the correction gain $A_c$ and the rotation amount $\theta_c$ of the phase corresponding to the input power level or the signal amplitude level calculated by the amplitude calculator 112 from the multiplier coefficient calculator 114, and may multiply with the modulation signal received from the modulation signal generator 100.

The rate controller 185 controls a conversion rate of the rate converter 190 and an operation rate of the ADC 170 based on the original digital complex signal received by the comparator 180 and the digital complex signal provided via the ADC 170. Concretely speaking, the rate controller 185 sets each of the conversion rate of the rate converter 190 and the operation rate of the ADC 170 at the first sampling rate when a ratio (or a difference) between the source signal and the signal passing through the power amplifier 140 exceeds a predetermined threshold value. The rate controller 185 sets each of the above at a second sampling rate which is lower than the first sampling rate when the ratio (or the difference) is the threshold value or less. The rate converter 190 converts the rate (transmission rate) of the modulation signal generated by the modulation signal generator 100 based on an instruction signal from the rate controller 185, and provides it to the comparator 180.

Figure 3:
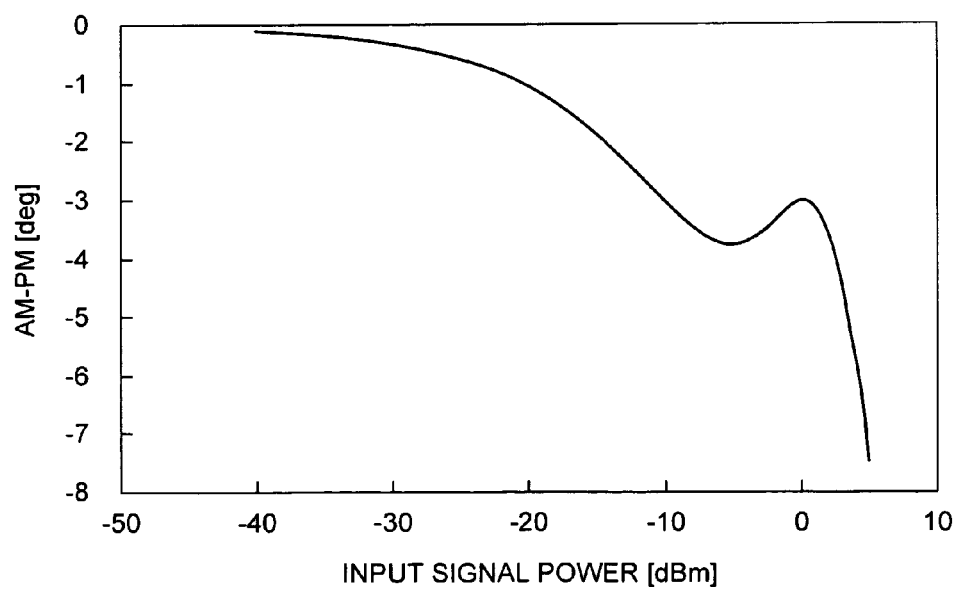
FIG. 3 is a view illustrating a relation between phases of the input signal power and a phase of an output signal of the power amplifier.
Figure 4:
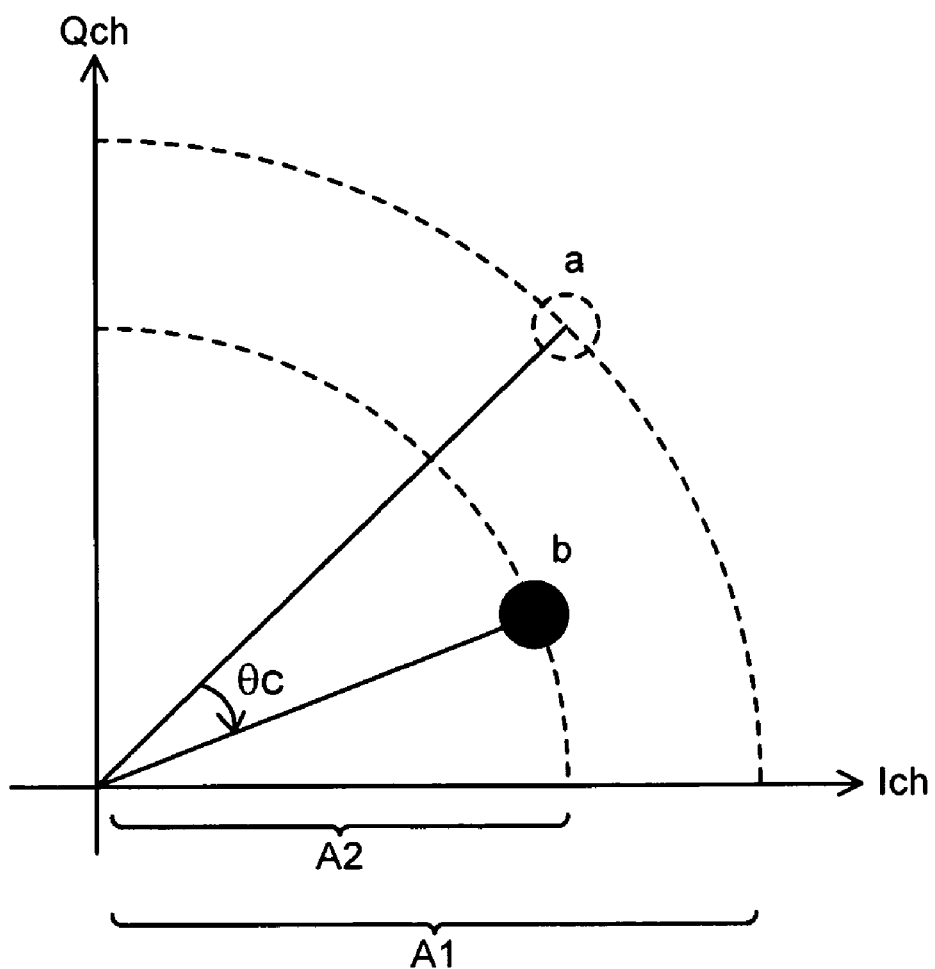
FIG. 4 is a view illustrating a displacement of a signal point on an IQ plane generated by distortion characteristics of the power amplifier.
Figure 5:
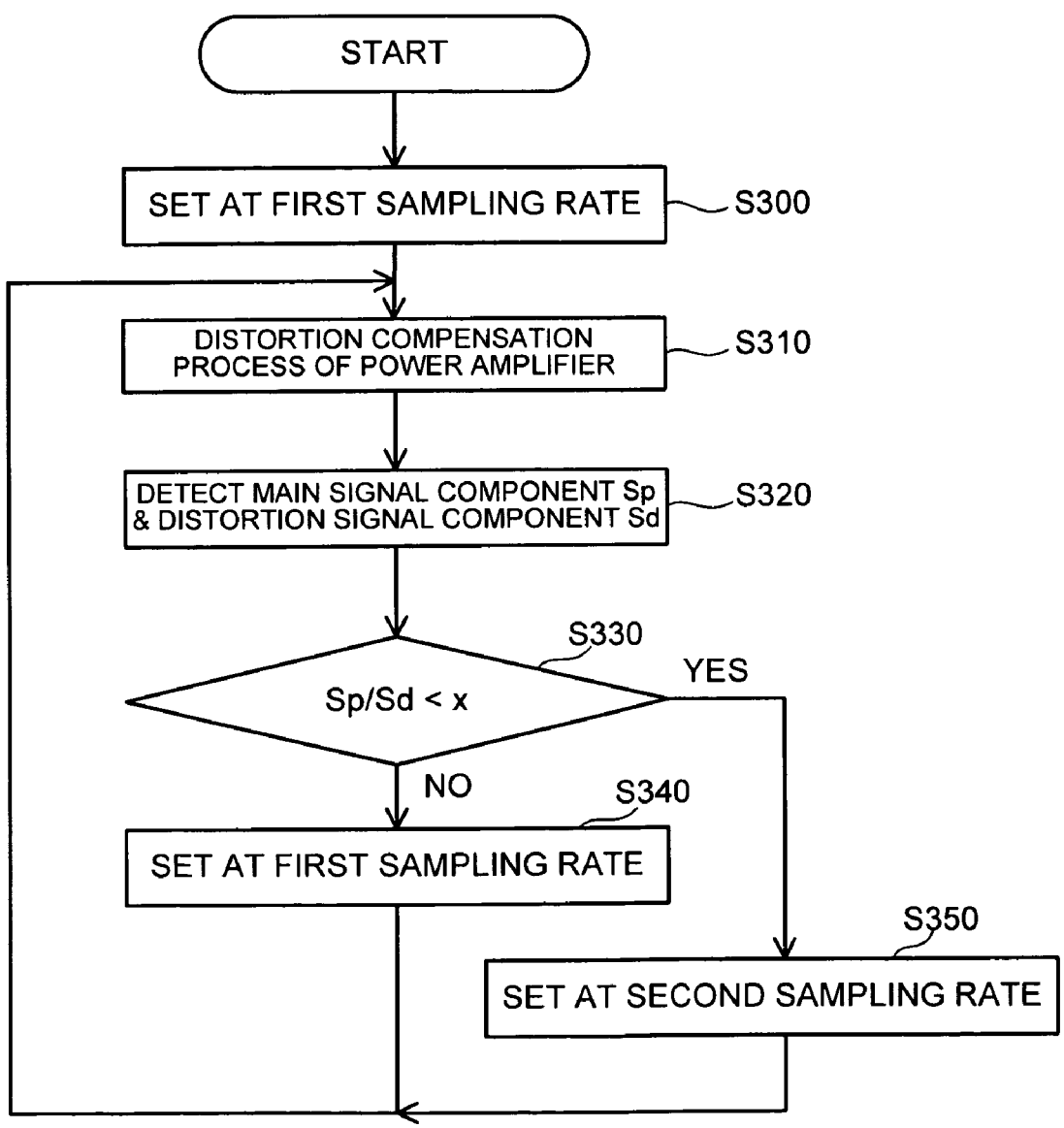
FIG. 5 is a flowchart illustrating operations of the transmitter of this embodiment.

(Distortion Characteristics of Power Amplifier) Here, the distortion characteristics of the power amplifier 140 are described with reference to FIG. 2 to FIG. 4.

Figure 2:
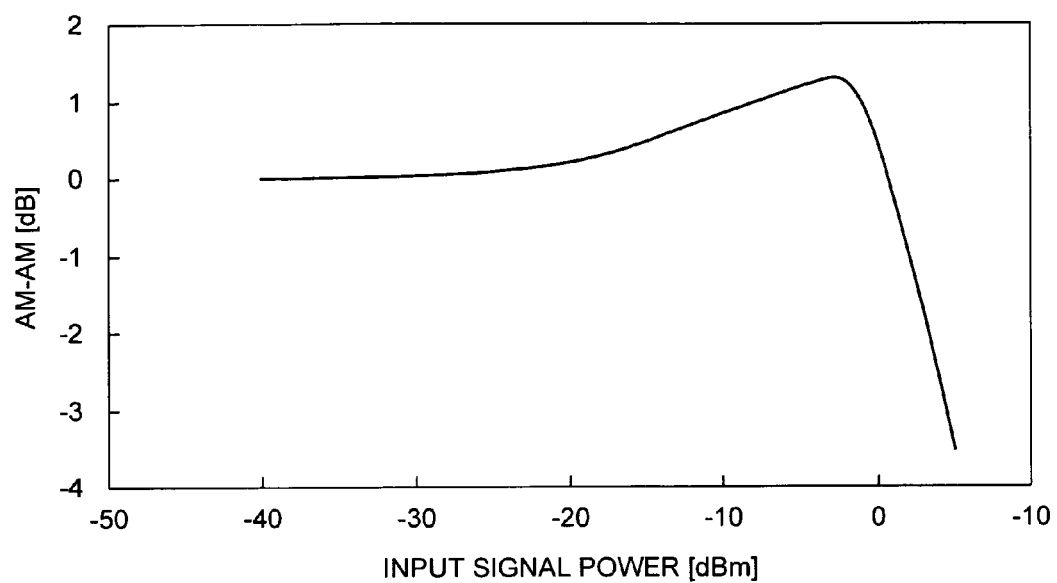
FIG. 2 is a view illustrating a relation between an input signal power and an output signal power of a power amplifier.

As illustrated in FIG. 2, it can be seen that a ratio between the input power and the output power rapidly becomes large and linearity of the power amplifier deteriorates as the signal power inputted to the power amplifier becomes large after a value (−5 [dBm] in FIG. 2) as a boundary. It is also the same as for the phase, and a phase displacement appearing in the output signal becomes large as the signal power inputted to the power amplifier becomes large as illustrated in FIG. 3. There is a relation represented by the following formula 3 between the amplitude value A of the signal inputted to the power amplifier and a signal power P, and displacements in an amplitude direction (A1→A2) and in a phase direction ($\theta_c$) resulting from the distortion characteristics of the power amplifier generate a displacement of a signal point (a→b) on an IQ plane, as illustrated in FIG. 4. The displacement of the signal point in digital communication becomes a cause of a transmission error, and it is not preferable.

$$P \cdot [dBm] = 20 * \log_{10}\left(\frac{A \cdot [V]}{\sqrt{2} \cdot 10^{-6}}\right) \quad (3)$$

A: signal voltage amplitude value

The comparator 180 compares the modulation signal at the first sampling rate received from the modulation signal generator 100 via the rate converter 190 and the output signal of the power amplifier at the first sampling rate received from the ADC 170, and calculates the distortion characteristics of the power amplifier as illustrated in FIG. 2. Concretely speaking, it can be calculated by dividing the signal inputted from the ADC 170 by the modulation signal inputted from the rate converter 190. The multiplier coefficient calculator 114 calculates a ratio (correction gain $A_c$) between the signal amplitude A1 obtained when it is amplified linearly at each input power level or at the signal amplitude level and an amplitude A2 of a distorted signal actually obtained via the power amplifier based on the distortion characteristics of the power amplifier calculated by the comparator 180, and the rotation amount $\theta_c$ of the phase provided to the output signal of the power amplifier by the distortion. Incidentally, it may be constituted such that the comparator 180 calculates the correction gain $A_c$ and the rotation amount $\theta_c$ of the phase, and the multiplier coefficient calculator 114 stores the obtained correction gain $A_c$ and the rotation amount $\theta_c$ of the phase, as stated above. The correction gain $A_c$ can be obtained by using the following expression.

$$A_C = \frac{A1}{A2} \quad (4)$$

As stated above, the multiplier coefficient calculator 114 is not able to receive the calculation value of the distortion characteristics (or the values of the correction gain $A_c$ and the rotation amount $\theta_c$ of the phase) from the comparator 180 at the initial operation of the transmitter, because the output signal from the power amplifier is not obtained. Accordingly, the multiplier coefficient calculator 114 outputs the initial value held in advance as the multiplier coefficient in the initial operation. The complex multiplier 116 complex multiplies the signal with the amplitude $A_c$ and the phase $\theta_c$ received from the multiplier coefficient calculator 114 and the signal with Ich and Qch received from the modulation signal generator 100, and outputs a complex signal (I'+Q') in which the distortion characteristics opposite to the distortion characteristics held by the power amplifier are multiplied to the DAC 120. The complex signal (I'+Q') provided to the DAC 120 can be asked by the following expression.

$$I'+Q'=(I+jQ) \times A_C \cdot e^{-j\theta_C} \quad (5)$$

In this embodiment, the comparator 180 provides the distortion characteristics (or the correction coefficient values) updated accordingly to the multiplier coefficient calculator 114, and therefore, the DPD processor 110 can provide the distortion compensation of the power amplifier with high accuracy.

(Control Operation of Sampling Rate) Next, operations of the transmitter 1 of this embodiment are described with reference to FIG. 1 and FIG. 5 to FIG. 8.

The modulation signal generator 100 generates the modulation signal of the digital complex signal, and provides it to the DPD processor 110. The amplitude calculator 112 calculates the amplitude value A of the modulation signal received from the modulation signal generator 100 and sends it to the multiplier coefficient calculator 114. In the initial state, the multiplier coefficient calculator 114 does not receive the distortion characteristics of the power amplifier 140 from the comparator 180, and therefore, the multiplier coefficient calculator 114 provides the initial value held by itself to the complex multiplier 116 as the multiplier coefficient. The complex multiplier 116 multiplies the modulation signal received from the modulation signal generator 100 and the multiplier coefficient received from the multiplier coefficient calculator 114, and sends the result to the DAC 120.

The DAC 120 converts the modulation signal of the digital complex signal which is multiplication processed into the analog complex base-band signal. The converted analog complex base-band signal is provided to the transmission signal processing block 130, and inputted to the quadrature modulator 135 via the LPF 131 and the gain variable amplifier 133. The quadrature modulator 135 multiplies the modulation signal of the analog complex base-band signal and the local signal generated by the local oscillator 137 to generate the radio frequency transmission signal, and provides it to the power amplifier 140 via the driver amplifier 139.

Figure 6:
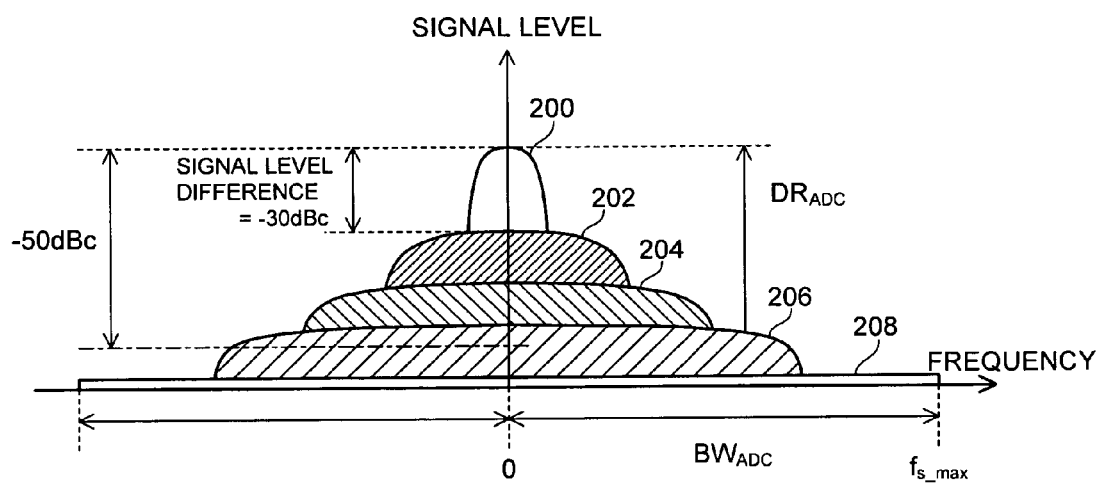
FIG. 6 is a view illustrating a spectrum example of the output signal of the power amplifier.

Here, FIG. 6 illustrates a spectrum of the output signal of the power amplifier 140 before the distortion compensation by a digital signal processing. A horizontal axis represents a frequency, a vertical axis represents a signal level, and a main signal component 200, a third harmonic distortion component 202, a fifth harmonic distortion component 204, a seventh harmonic distortion component 206 and a quantization noise component 208 are illustrated. As illustrated in FIG. 6, a higher harmonic component is included in the output signal of the power amplifier 140 when the output signal of the power amplifier 140 is distorted largely. As a result, the spectrum of the output signal of the power amplifier 140 is distributed for a wide frequency band. In the example illustrated in FIG. 6, a case when the output signal includes up to the distortion signal component in seventh harmonic is illustrated.

The CPL 150 distributes a part of the output signal of the power amplifier 140 including the higher harmonic distortion signal component to the reception signal processing block 160. When the output signal of the power amplifier 140 is received, the ATT 162 attenuates a power level, and the quadrature demodulator 164 multiplies the attenuated signal and the local signal generated by the local oscillator 137 to convert into the analog complex base-band signal.

The rate controller 185 sets a sampling rate of the ADC 170 and the conversion rate of the rate converter 190 at the first sampling rate as an initial setting (step 300, hereinafter referred to as "S300"). In the example illustrated in FIG. 6, all levels of the third harmonic distortion, the fifth harmonic distortion and the seventh harmonic distortion become a threshold value or more when the threshold value of a signal level difference between the main signal component and the distortion signal component is set at −50 dBc. Namely, the ADC 170 is necessary to operate at the sampling rate capable of corresponding to the seventh harmonic distortion because the ADC 170 has to feed back up to the seventh harmonic distortion to the comparator 180. When a bandwidth of the main signal component is set at 20 MHz in a radio frequency band and at 10 MHz in a base-band, the first sampling rate at which the ADC 170 has to operate becomes 140 MHz or more (10 MHz×seventh harmonic×2). Consequently, the rate controller 185 sets the sampling rate of the ADC 170 and the conversion rate of the rate converter 190 at 140 MHz, as the first sampling rate ($f_{Smax}$).

The ADC 170 converts the analog complex base-band signal converted by the quadrature demodulator 164 into the digital complex signal at the first sampling rate. On the other hand, the rate converter 190 converts the modulation signal of the modulation signal generator 100 into the modulation signal with the transmission rate at the first sampling rate (here, the transmission rate is kept as it is). The comparator 180 compares the digital complex signal converted by the ADC 170 and the modulation signal of the digital complex signal converted by the rate converter 190, and calculates the distortion characteristics of the power amplifier 140. The calculated distortion characteristics are provided to the multiplier coefficient calculator 114. The multiplier coefficient calculator 114 calculates the multiplier coefficient based on the received distortion characteristics and the amplitude value A calculated by the amplitude calculator 112, and provides the result to the complex multiplier 116. The multiplier coefficient calculator 114 keeps the provided distort ion characteristics to prepare for the next signal processing. The complex multiplier 116 multiplies the modulation signal from the modulation signal generator 100 and the multiplier coefficient calculated by the multiplier coefficient calculator 114 to perform the distortion compensation process (S310).

Figure 7:
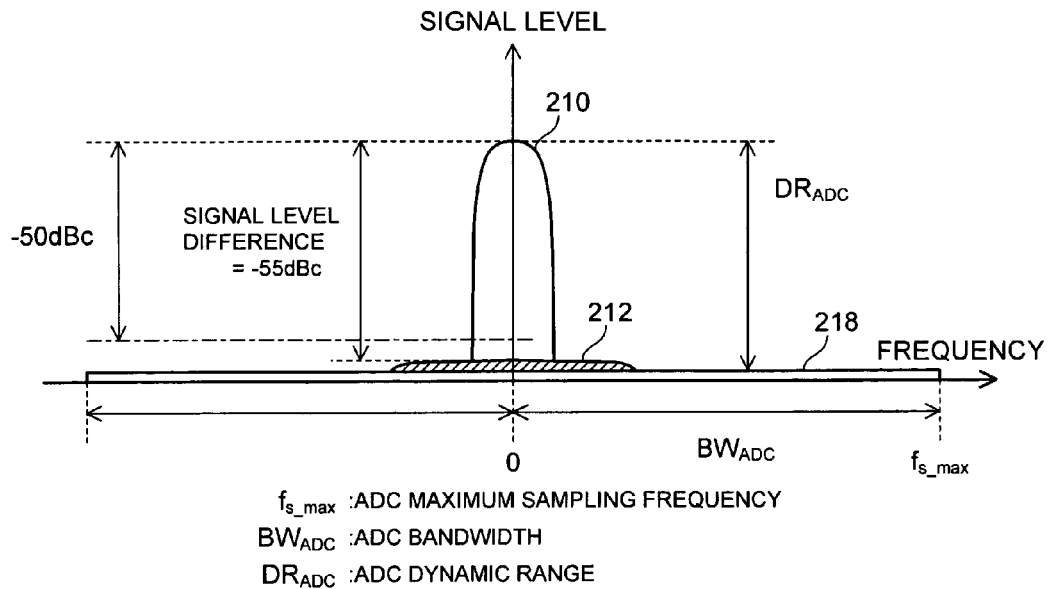
FIG. 7 is a spectral view illustrating an operation example of the power amplifier of the transmitter of this embodiment.

Here, FIG. 7 illustrates a spectrum of the output signal of the power amplifier 140 after the distortion compensation by the digital signal processing. After the distortion compensation, the distortion signal component included in the output signal of the power amplifier 140 is suppressed up to a calculation error of the distortion characteristics, and the higher harmonic distortions such as the seventh harmonic distortion and the fifth harmonic distortion included in the output signal of the power amplifier 140 are suppressed up to a value near a noise level as illustrated in FIG. 7. In other words, the frequency bandwidth in which the spectrum of the output signal of the power amplifier 140 is distributed becomes narrow. In the example in FIG. 7, the output signal spectrum when the fifth and seventh harmonic distortions are embedded in a noise floor is illustrated though the third harmonic distortion signal component remains at higher level than the noise floor.

The rate controller 185 detects a modulation signal Sp (main signal component) of the digital complex signal from the rate converter 190 and a digital complex signal Sd (the signal component including the distortion) from the ADC 170 (S320), and compares with a threshold value x (S330).

When a ratio (or a difference) between the main signal component Sp and the signal component Sd including the distortion is the threshold value or more ("No" in S330), many distortion signal components are still included in the output signal of the power amplifier 140. In such a case, the rate controller 185 sets both of the sampling rate of the ADC 170 and the conversion rate of the rate converter 190 at the first sampling rate (S340). Namely, the first sampling rate is kept.

When the ratio (or the difference) between the main signal component Sp and the signal component Sd including the distortion is smaller than the threshold value ("Yes" in S330), the distortion signal component included in the output signal of the power amplifier 140 becomes small. In such a case, the rate controller 185 sets both of the sampling rate of the ADC 170 and the conversion rate of the rate converter 190 at the second sampling rate slower than the first sampling rate (S350). At this time, it is desirable that the first sampling rate has a relation of 2n times (here, "n" is an integer number) of the second sampling rate.

As illustrated in FIG. 7, it becomes impossible to detect the higher harmonic distortion signal component with high accuracy if the higher harmonic distortion component is enough suppressed up to the noise level and the distortion signal component included in the output signal of the power amplifier 140 becomes small after the distortion compensation. In other words, it is enough for the comparator 180 if it is possible to detect the level of the third harmonic distortion being the distortion component still remained. This means that it is not necessary to feed back the signals in the frequency band where the higher harmonic distortion exists, from the power amplifier 140 to the comparator 180. Accordingly, it becomes possible to set the sampling rate of the ADC 170 at the second sampling rate which is lower than the first sampling rate. In this example, the signals in the signal bandwidth where the third harmonic distortion exists, namely in the frequency bandwidth up to 30 MHz (10 MHz×third harmonic) are to be fed back, and therefore, the second sampling rate ($=f_{Smin}$) at which the ADC 170 operates becomes 60 MHz.

Incidentally, when the sampling rate of the ADC 170 is made low, the sampling rate of the modulation signal of the digital complex signal being a comparison object by the comparator 180 must be synchronized thereto. Specifically, the rate converter 190 performs a decimation for a signal data based on an instruction from the rate controller 185. The sampling rates (transmission rates) of each of the digital complex signal from the ADC 170 and the modulation signal of the digital complex signal from the rate converter 190 are matched, and the comparator 180 performs the comparison process for each of them.

In the meantime, when the rate controller 185 changes the sampling rate from the first sampling rate to the second sampling rate, the distortion characteristics calculated by the comparator 180 are values obtained at the second sampling rate, and therefore, it cannot be used for the multiplication process at the complex multiplier 116 as it is. Accordingly, it is necessary for the multiplier coefficient calculator 114 to perform an up-sampling process so as to correspond to the modulation signal (=the first sampling rate) inputted to the complex multiplier 116. Specifically, the multiplier coefficient calculator 114 converts a rate by performing an interpolation and filtering process of data, or a linear interpolation process, and so on. The rate conversion in the multiplier coefficient calculator 114 is controlled by an instruction signal from the rate controller 185.

After that, the rate controller 185 switches the first sampling rate and the second sampling rate (S310 to S350) according to level of the distortion component included in the output signal of the power amplifier 140. Incidentally, the comparator 180 may stop a new calculation of the distortion characteristic during a period when the rate controller 185 controls the sampling rate of the ADC 170 and the conversion rate of the rate converter 190 to be the second sampling rates. That is because, as illustrated in FIG. 7, the distortion signal component is enough suppressed while the linearity of the power amplifier 140 is compensated, and therefore, it is conceivable that a significant fluctuation does not occur in the distortion characteristic.

Figure 8:
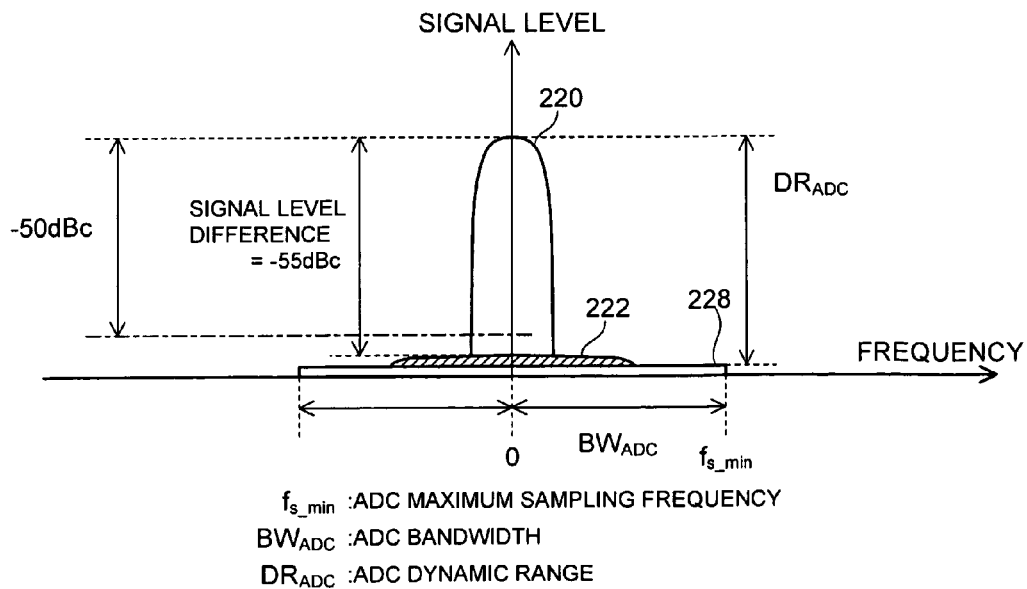
FIG. 8 is a spectral view illustrating the operation example of the power amplifier of the transmitter of this embodiment.

FIG. 8 illustrates a spectrum when the sampling rate of the ADC 170 is lowered to the second sampling rate ($f_{Smin}$) after the distortion compensation process is performed by the ADC 170 operating at the first sampling rate ($f_{Smax}$). As stated above, the higher harmonic distortion component is enough suppressed after the higher harmonic distortion compensation is performed, and therefore, the distortion compensation can be performed even if the sampling rate of the ADC 170 is lowered.

(Lowering of Sampling Rate and Power Consumption)

Here, a meaning in which the rate controller 185 controls the sampling rate in the transmitter of the present embodiment is described.

A relational expression illustrate below (Expression of Figure of merit: Walden, R. H., "Analog-to-digital converter survey and analysis", IEEE Journal on Selected Areas in Communications, Volume 17, No. 4, pp. 539-550, April 1999.) is known as for a relation between the sampling rate of the ADC 170 and the power consumption.

$$F = 2^n \times \frac{f_s}{P} \qquad (6)$$

F: figure of merit
n: number of bits of analog-digital converter
fs: sampling rate of analog-digital converter
P: power consumption of analog-digital converter As it is represented by the formula 6, it can be seen that the power consumption decreases to the half as the sampling rate decreases to the half when the analog-digital converters having equivalent performances, namely having the same Figure of Merit F and the same number of bits are compared. Namely, according to the transmitter in this embodiment, the sampling rate of the ADC 170 is controlled by the rate controller 185 in accordance with the degree of a linearity compensation process of the power amplifier 140, and therefore, the power consumption of the transmitter can be reduced.

As stated above, the transmitter according to the embodiment decreases the sampling rate of the analog-digital converter to feed back the output signal of the power amplifier in accordance with the amount of the distortion component in the output signal of the power amplifier, and therefore, the power consumption can be reduced. Besides, the calculation process such as the multiplication in the comparator can also be reduced by decreasing the sampling rates of the complex signals outputted from the ADC 170 and the rate converter 190. This also contributes to the reduction of the power consumption. Namely, a distortion compensator, a transmitter, and a distortion compensation method capable of effectively suppressing the power consumption, heat generation, and so on, and suppressing the apparatus scale can be provided.

It should be noted that the present invention is not limited to the above-described embodiments as they are, and in an implementation stage, it can be embodied by modifying components thereof within a range not departing from the spirit of the invention. For example, the comparator may be constituted so as to calculate not the distortion characteristics of the power amplifier but the opposite distortion characteristics or the multiplier coefficient. Also, the plural components disclosed in the above-described embodiments can be appropriately combined to form various inventions. For example, some of all the components shown in the embodiments may be eliminated. Moreover, components from different embodiments may be combined appropriately.

What is claimed is:

1. A distortion compensator for reducing a level of a distortion component included in an output analog signal of an amplifier, comprising:
   an A/D converter to convert the output analog signal of the amplifier into a digital output signal;
   a comparator to generate a distortion characteristic of the amplifier based on a digital input signal and the digital output signal;

a rate controller to control the A/D converter to change a sampling rate thereof based on the digital input signal and the digital output signal;

a predistorter to multiply the digital input signal and a compensation value for compensating the amplifier, the compensation value being calculated based on the digital input signal and the distortion characteristic of the amplifier; and a D/A converter to convert multiplication result of the predistorter into an analog input signal to input the analog input signal to the amplifier.

2. The distortion compensator according to claim 1, wherein the rate controller calculates a ratio or a difference between the digital input signal and the digital output signal to change the sampling rate to a second sampling rate which is lower than a first sampling rate from the first sampling rate when the ratio or the difference becomes a predetermined threshold value or less.

3. The distortion compensator according to claim 2, wherein the comparator does not newly calculate the distortion characteristic while the rate controller controls the sampling rate at the second sampling rate.

4. The distortion compensator according to claim 2, wherein the first sampling rate is 2n times (here, "n" is a positive integer number) of the second sampling rate.

5. The distortion compensator according to claim 1, wherein the predistorter includes:
an amplitude calculator to generate a signal amplitude value corresponding to the digital input signal;
a multiplier coefficient calculator to generate the compensation value based on the signal amplitude value and the distortion characteristic; and
a multiplier to multiply the digital input signal and the compensation value.

6. The distortion compensator according to claim 1, wherein the A/D converter is constituted by a delta-sigma type analog-digital converter.

7. The distortion compensator according to claim 1, further comprising:
a rate converter to convert a transmission rate of the digital input signal provided to the comparator,
wherein the rate controller controls the rate converter to make the transmission rate of the digital input signal provided to the comparator the same as the sampling rate of the A/D converter.

8. A transmitter, comprising:
a power amplifier to amplify a transmission signal;
a power divider to divide an output signal of the power amplifier to generate a feedback signal;
an A/D converter to convert the feedback signal into a digital demodulation signal;
a comparator to generate a distortion characteristic of the power amplifier based on a digital modulation signal and the digital demodulation signal;
a rate controller to control the A/D converter to change a sampling rate thereof based on the digital modulation signal and the digital demodulation signal;
a predistorter to multiply the digital modulation signal and a compensation value for compensating the power amplifier, the compensation value being calculated based on the digital modulation signal and the distortion characteristic of the power amplifier;
a D/A converter to convert multiplication result of the predistorter into the transmission signal in an analog format to input the transmission signal to the power amplifier.

9. A distortion compensation method for reducing a level of a distortion signal component included in an output analog signal of an amplifier, comprising:
converting the output analog signal of the amplifier into a digital output signal by an A/D converter;
generating a distortion characteristic of the amplifier based on a digital input signal and the digital output signal by a comparator;
controlling the A/D converter to change a sampling rate thereof by a rate controller based on the digital input signal and the digital output signal;
calculating a compensation value for compensating the amplifier by a predistorter based on the digital input signal and the distortion characteristic of the amplifier;
multiplying the digital input signal and the compensation value by the predistorter; and
converting multiplication result of the predistorter into an analog input signal of the amplifier by a D/A converter.

10. A distortion compensator for reducing a level of a distortion component included in an output analog signal of an amplifier, comprising:
an A/D converter to convert the output analog signal of the amplifier into a digital output signal;
a comparator to generate a distortion characteristic of the amplifier based on a digital input signal and the digital output signal;
a rate controller to control a sampling rate of the A/D converter based on the digital input signal and the digital output signal;
a predistorter to multiply the digital input signal and a compensation value for compensating the amplifier, the compensation value being calculated based on the digital input signal and the distortion characteristic of the amplifier;
a D/A converter to convert the multiplication result of the predistorter into an analog input signal to input the analog input signal to the amplifier; and
a rate converter to convert a transmission rate of the digital input signal provided to the comparator,
wherein the rate controller controls the rate converter based on the digital input signal and the digital output signal.

11. The distortion compensator according to claim 10, wherein the rate controller calculates a ratio or a difference between the digital input signal and the digital output signal, and changes the sampling rate to a second sampling rate which is lower than a first sampling rate from the first sampling rate when the ratio or the difference becomes a predetermined threshold value or less.

12. The distortion compensator according to claim 11, wherein the comparator does not newly calculate the distortion characteristic while the rate controller controls the sampling rate at the second sampling rate.

13. The distortion compensator according to claim 11, wherein the first sampling rate is 2n times of the second sampling rate, n being a positive integer number.

14. The distortion compensator according to claim 10, wherein the predistorter comprises:
an amplitude calculator to generate a signal amplitude value corresponding to the digital input signal;
a multiplier coefficient calculator to generate the compensation value based on the signal amplitude value and the distortion characteristic; and
a multiplier to multiply the digital input signal and the compensation value.

15. The distortion compensator according to claim 10, wherein the A/D converter is constituted by a delta-sigma type analog-digital converter.

16. A transmitter, comprising:

a power amplifier to amplify a transmission signal;

a power divider to divide an output signal of the power amplifier to generate a feedback signal;

an A/D converter to convert the feedback signal into a digital demodulation signal;

a comparator to generate a distortion characteristic of the power amplifier based on a digital modulation signal and the digital demodulation signal;

a rate controller to control a sampling rate of the A/D converter based on the digital modulation signal and the digital demodulation signal;

a predistorter to multiply the digital modulation signal and a compensation value for compensating the power amplifier, the compensation value being calculated based on the digital modulation signal and the distortion characteristic of the power amplifier;

a D/A converter to convert the multiplication result of the predistorter into the transmission signal in an analog format to input the transmission signal to the power amplifier; and a rate converter to convert a transmission rate of the digital input signal provided to the comparator, wherein the rate controller controls the rate converter based on the digital input signal and the digital output signal.

17. A distortion compensation method for reducing a level of a distortion signal component included in an output analog signal of an amplifier, comprising:

converting the output analog signal of the amplifier into a digital output signal by an A/D converter;

generating a distortion characteristic of the amplifier based on a digital input signal and the digital output signal by a comparator;

controlling a sampling rate of the A/D converter by a rate controller based on the digital input signal and the digital output signal;

calculating a compensation value for compensating the amplifier by a predistorter based on the digital input signal and the distortion characteristic of the amplifier;

multiplying the digital input signal and the compensation value by the predistorter;

converting the multiplication result of the predistorter into an analog input signal of the amplifier by a D/A converter;

converting a transmission rate of the digital input signal provided to the comparator by a rate converter; and controlling the rate converter based on the digital input signal and the digital output signal by the rate controller.

* * * * *